(12) United States Patent
Gabriel et al.

(10) Patent No.: US 6,943,448 B2
(45) Date of Patent: Sep. 13, 2005

(54) MULTI-METAL LAYER MEMS STRUCTURE AND PROCESS FOR MAKING THE SAME

(75) Inventors: Kaigham J. Gabriel, Pittsburgh, PA (US); Xu Zhu, Pittsburgh, PA (US)

(73) Assignee: Akustica, Inc., Pittsburgh, PA (US)

( * ) Notice: Subject to any disclaimer, the term of this patent is extended or adjusted under 35 U.S.C. 154(b) by 99 days.

(21) Appl. No.: 10/349,619

(22) Filed: Jan. 23, 2003

(65) Prior Publication Data
US 2004/0145056 A1 Jul. 29, 2004

(51) Int. Cl.⁷ .......................... H01L 23/48; H01L 23/52
(52) U.S. Cl. ...................... 257/758; 438/619; 438/622
(58) Field of Search ........................... 257/758, 746, 257/759, 760, 531; 438/619, 622, 700, 723, 743

(56) References Cited

U.S. PATENT DOCUMENTS

| | | | |
|---|---|---|---|
| 4,515,997 A | 5/1985 | Stinger, Jr. | |
| 5,619,061 A | 4/1997 | Goldsmith et al. | |
| 5,717,631 A | 2/1998 | Carley et al. | |
| 5,970,315 A | 10/1999 | Carley et al. | |
| 6,069,540 A | 5/2000 | Berenz et al. | |
| 6,100,477 A | 8/2000 | Randall et al. | |
| 6,255,757 B1 | 7/2001 | Dhuler et al. | |
| 6,291,922 B1 | 9/2001 | Dhuler | |
| 6,307,169 B1 | 10/2001 | Sun et al. | |
| 6,320,145 B1 | 11/2001 | Tai et al. | |
| 6,373,007 B1 | 4/2002 | Calcatera et al. | |
| 6,376,787 B1 | 4/2002 | Martin et al. | |
| 6,386,507 B2 | 5/2002 | Dhuler et al. | |
| 6,437,965 B1 | 8/2002 | Adkins et al. | |
| 6,469,602 B2 * | 10/2002 | Ruan et al. | 335/78 |
| 6,624,003 B1 * | 9/2003 | Rice | 438/106 |
| 6,657,832 B2 * | 12/2003 | Williams et al. | 361/15 |
| 2003/0222738 A1 * | 12/2003 | Brown et al. | 333/206 |

FOREIGN PATENT DOCUMENTS

| | | |
|---|---|---|
| EP | 1063866 A1 | 12/2000 |
| JP | 58121897 | 7/1983 |
| WO | WO 0120948 A2 | 3/2001 |

OTHER PUBLICATIONS

Fedder, G.K., Santhanam, S., Reed, M.L., Eagle, S.C., Guilou, D.F., Lu, M.S.–C. and Carley, L.R., "Laminated high–aspect–ratio microstructures in a conventional CMOS process," Sensors and Actuators, A 57, pp. 103–110, 1996.

(Continued)

*Primary Examiner*—Hoa Pham
*Assistant Examiner*—Ginette Peralta
(74) *Attorney, Agent, or Firm*—Thorp Reed & Armstrong, LLP

(57) ABSTRACT

The present invention is directed to a structure comprised of alternating layers of metal and sacrificial material built up using standard CMOS processing techniques, a process for building such a structure, a process for fabricating devices from such a structure, and the devices fabricated from such a structure. In one embodiment, a first metal layer is carried by a substrate. A first sacrificial layer is carried by the first metal layer. A second metal layer is carried by the sacrificial layer. The second metal layer has a portion forming a micro-machined metal mesh. When the portion of the first sacrificial layer in the area of the micro-machined metal mesh is removed, the micro-machined metal mesh is released and suspended above the first metal layer a height determined by the thickness of the first sacrificial layer. The structure may be varied by providing a base layer of sacrificial material between the surface of the substrate and the first metal layer. In that manner, a portion of the first metal layer may form a micro-machined mesh which is released when a portion of the base sacrificial layer in the area of the micro-machined mesh is removed. Additionally, a second layer of sacrificial material and a third metal layer may be provided. A micro-machined mesh may be formed in a portion of the third metal layer. The structure of the present invention may be used to construct variable capacitors, switches and, when certain of the meshes are sealed, microspeakers and microphones.

6 Claims, 5 Drawing Sheets

OTHER PUBLICATIONS

Pedersen, Michael, Olthuis, Wouter and Bergveld, Piet, "A silicon condenser microphone with polyimide diaphragm and backplate," MESA Research Institute, University of Twente, Netherlands, pp. 97–104.

Parameswaran, M., Baltes, H.P., Ristic, Lj., Dhaded, A.C. and Robinson, A.M., "A new approach for the fabrication of micromechanical structures," Sensors and Actuators, vol. 19, pp. 289–307, 1989.

J. Marshal Et Al., "Realizing suspended structures on chips fabricated by CMOS foundry processes through MOSIS service," NISTIR 5402, U.S. National Institute of Standards and Technology, Gaithersburg, MD 20899, 1994.

H. Chen. C. Chang, K. Yen, H. Huang, J. Chio, C. Wu and P. Chang "Fabrication of the planar angular rotator using the CMOS process," in Proc. 13th Annual International Conference on Micro Electro Mechanical System (MEMS 00'), pp. 17–22, 2000.

Y. Huang and E.S. Kim, "Piezoelectrically Actuated microcantilever for Actuated Mirror Array Application," State Sensor and Actuator Workshop, Hilton Head Island, SC, Jun. 2–6, 1996, pp. 191–195.

Neumann, Jr., John J. and Gabriel, Kaigham J., CMOS-MEMS Membrane for a Audio–Frequency Acoustic Actuation, Electrical and Computer Engineering Department, Carnegie Mellon University, 2001, pp. 236–239.

Diamond, Brett M., Neumann, Jr., John J. and Gabriel, Kaigham J., Digital Sound Reconstruction Using Arrays of CMOS–MEMS Microspeakers, MEMS Laboratory, Electrical and Computer Engineering Department, Carnegie Mellon University, 2002, pp. 292–295.

* cited by examiner

MULTI-METAL LAYER MEMS STRUCTURE AND PROCESS FOR MAKING THE SAME

BACKGROUND OF THE INVENTION

The present invention is directed generally to microelectromechanical system (MEMS) devices and, more particularly, to MEMS devices constructed from alternating layers of metal and a sacrificial material.

MEMS devices are typically constructed using traditional CMOS processing techniques. Such processing techniques are well developed as they are used to fabricate many different types of integrated circuits such as memory devices, processors, logic circuits, to name a few. As a result, the construction of MEMS devices is advanced whenever there are improvements in CMOS processing techniques.

In fabricating a typical MEMS device, various layers of material are formed on a substrate and etched according to a pattern to form the desired device(s). The resulting device is typically formed of a composite of various layers of materials. The device is then released from the substrate by removing a portion of the substrate from under the device. MEMS devices constructed using such techniques include, for example, beams of various design used for accelerometers, switches, variable capacitors, sensors, to name a few, and flexible meshes used for capacitors, microspeakers and microphones.

When devices are comprised of composite structures, the different materials comprising the composite structure respond to thermal and other types of stress differently, which may cause the structure to bend or fail prematurely. Releasing the device by removing a portion of the substrate requires close control over process parameters to insure that the right amount of substrate is removed. Under-etching, and the device may not be released; over-etching and the device may have characteristics that vary from what was designed and expected. Thus, the need exists for a process that is easy to implement with CMOS processing techniques and that allows for devices to be constructed of a single material in a simple, easily repeatable manner.

BRIEF SUMMARY OF THE INVENTION

The present invention is directed to a structure comprised of a first metal layer carried by a substrate. A first sacrificial layer is carried by the first metal layer. A second metal layer is carried by the sacrificial layer. The second metal layer has a portion forming a micro-machined metal mesh. When the portion of the first sacrificial layer in the area of the micro-machined metal mesh is removed, the micro-machined metal mesh is released and suspended above the first metal layer a height determined by the thickness of the first sacrificial layer. The structure may be varied by providing a base layer of sacrificial material between the surface of the substrate and the first metal layer. In that manner, a portion of the first metal layer may form a micro-machined mesh which is released when a portion of the base sacrificial layer in the area of the micro-machined mesh is removed. Additionally, a second layer of sacrificial material and a third metal layer may be provided. A micro-machined mesh may be formed in a portion of the third metal layer. The first, second and third metal layers need not correspond to metal one, metal two, and metal three, respectively, but may be implemented in any appropriate metal layers.

The present invention is also directed to a composite structure made of alternating layers of metal and sacrificial material. Such a structure may be comprised of a first metal layer carried by the substrate. A first layer of sacrificial material is carried by the first metal layer. A second metal layer is carried by the first layer of sacrificial material. A portion of the second metal layer is patterned to form a micro-machined metal mesh. Additional alternating layers of metal and sacrificial material may be provided. It is anticipated that such a composite device would be produced by a CMOS fabrication facility and may be, although not required to be, transferred to another facility for post-fabrication processing in which the mesh is released and, where appropriate, sealed.

The present invention is also directed to a process of fabricating a series of alternating stacked layers of metal and sacrificial material. The process is comprised of forming a first metal layer on a substrate; forming a first layer of sacrificial material on the first metal layer; forming a second metal layer on the first layer of sacrificial material; and patterning the second metal layer to form a micro-machined metal mesh. Additional steps may be added so that additional layers of metal and sacrificial material are provided. Additional patterning steps may be provided for forming additional micro-machined meshes in the additional metal layers.

The present invention is also directed to processing such a fabricated stack of layers. Such fabrication contemplates a set of dry etch processes that are intended to fabricate multi-metal layer MEMS structures. The process can be instantiated in post-CMOS micro-machining where multi-metal layers are an intrinsic part of the process. The etch may be used, either with or without a mask, to remove the layers of sacrificial material thereby releasing the various meshes. Where appropriate, certain of the meshes may be sealed.

Devices that can be realized using this set of processes include on-chip variable capacitors and on-chip mechanical switches. By sealing the micro-machined metal mesh formed by the second metal layer, on-chip parallel plate microphones as well as on-chip differential parallel plate microphones can be constructed. The structural metals which may be used in the present invention come from standard semi-conductor process metal interconnects such as aluminum or copper, which are current mainstream CMOS manufacturing materials. The sacrificial material may be a dielectric material located between the metal interconnects. No additional sacrificial material needs to be added to the CMOS process. Unlike other post-CMOS micro-machining processes, etching into the silicon substrate is not required for releasing the MEMS structures. Those advantages and benefits, and others, will be apparent from the Detailed Description of the Invention hereinbelow.

BRIEF DESCRIPTION OF THE DRAWINGS

For the present invention to be easily understood and readily practiced, the present invention will now be described, for purposes of illustration and not limitation, in conjunction with the following figures, wherein.

DETAILED DESCRIPTION OF THE INVENTION

Figure 1:
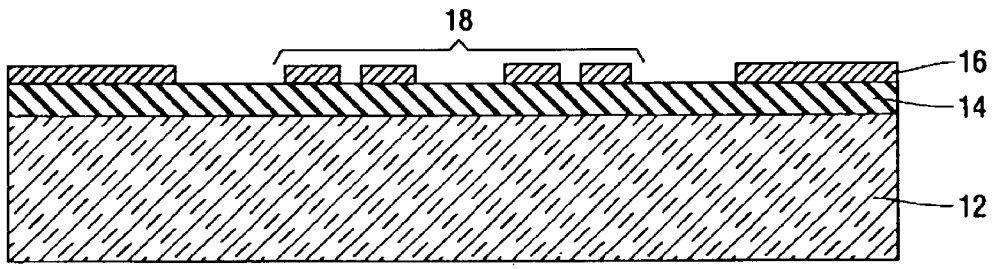
FIG. 1 illustrates a substrate after a base sacrificial layer and a first metal layer have been formed, and the first metal layer patterned to form a micro-machined mesh.

FIGS. 1–4 illustrate a process in which a multi-layer structure 10 (see FIG. 4) is constructed by forming alternating layers of sacrificial material and metal on a substrate. "Forming" as used herein is intended to be used in its broadest sense of using any type of CMOS process, e.g. chemical vapor deposition, sputtering, etc. to deposit, form or otherwise create a layer of material. Also, references herein to a first layer of metal, a second layer of metal, etc. need not correspond to metal one, metal two, etc. The first layer of metal may be implemented in, for example, metal two. The substrate may be, for example, a silicon substrate 12 typically used in CMOS manufacturing processes. As seen in FIG. 1, a base layer of sacrificial material 14 may be formed on the substrate 12. The sacrificial layer 14 may be any of a variety of materials that may be dry etched with an etchant to which the silicon substrate 12 is impervious. For example, dielectrics such as silicon dioxide, fluorine enriched silicon dioxide or organic substances may be used to form the sacrificial layers.

In one embodiment, a first metal layer 16 is formed on the base layer of sacrificial material 14. It is anticipated, but not required, that the first metal layer 16, and subsequent metal layers, will be typical metals used in CMOS processing such as, for example, copper and aluminum. Using known techniques, the first metal layer 16 may be patterned to form a metal mesh 18. The thickness of the base layer of sacrificial material 14 determines the height at which the metal mesh 18 may eventually be suspended above the substrate 12. Forming of the metal mesh may be in accordance with the techniques disclosed in International Publication No. WO/01/20948 A2 published 22 Mar. 2001, entitled MEMS Digital-to-Acoustic Transducer With Error Cancellation, the entirety of which is hereby incorporated by reference.

Figure 2:
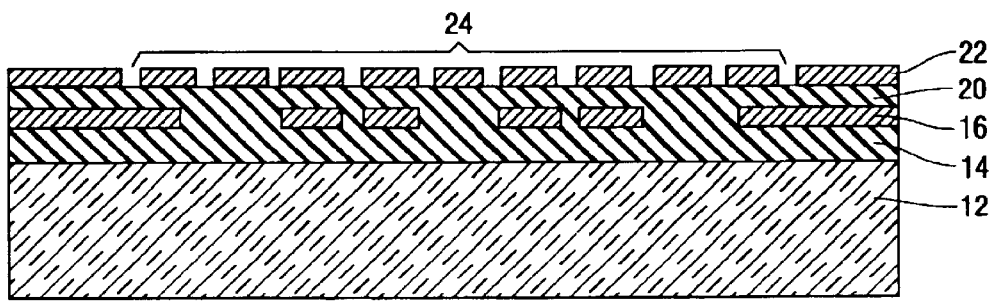
FIG. 2 illustrates the substrate of FIG. 1 after a first sacrificial layer and a second metal layer have been formed, and the second metal layer patterned to form a micro-machined mesh.

In FIG. 2, a first layer of sacrificial material 20, which may be the same type of material as the base layer of sacrificial material 14, is formed so as to be carried by the first metal layer 16. In addition to being carried by the first metal layer 16, the sacrificial material fills in the gaps formed by the first mesh 18. As a result, the surface of the first layer of sacrificial material 20 may need to be subjected to a processing step to smooth the surface. Thereafter, a second metal layer 22 is formed so as to be carried by the first layer of sacrificial material 20. The second metal layer 22 may be patterned to form a metal mesh 24. The metal mesh 24 will overlie, at least in part, the metal mesh 18 formed in the first metal layer 16.

Figure 3:
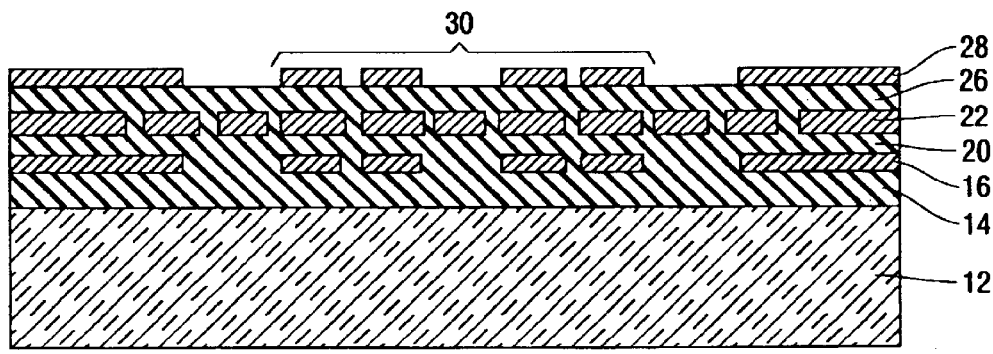
FIG. 3 illustrates the substrate of FIG. 2 after a second sacrificial layer and second metal layer have been formed, and the third metal layer patterned to form a micromachined mesh.

Turning to FIG. 3, a second layer of sacrificial material 26 is formed on top of the second metal layer 22. The second layer of sacrificial material 26 may be constructed of the same material as the base layer of sacrificial material 14 and, in addition to being supported by the second metal layer 22, fills in the metal mesh 24. Thereafter, the second layer of sacrificial material 26 may be subjected to a processing step, if necessary, to smooth the surface. A third metal layer 28 may be formed on top of the second layer of sacrificial material 26. The third metal layer 28 may be patterned to form a metal mesh 30. The metal mesh 30 overlies, at least in part, the mesh 24 formed in a portion of the second metal layer 22.

Figure 4:
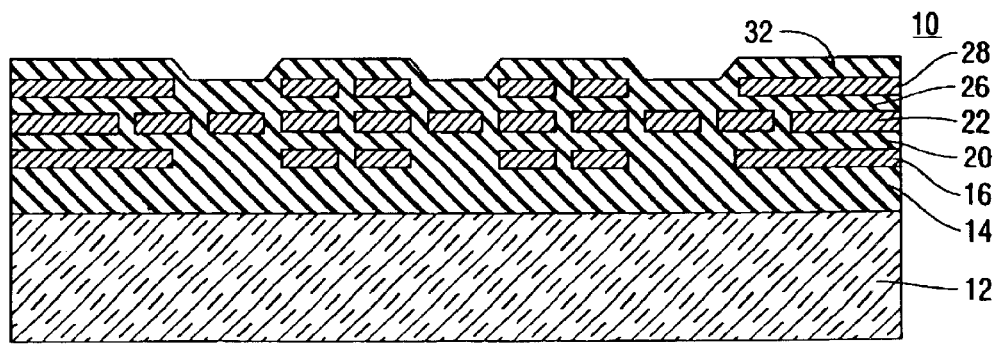
FIG. 4 illustrates the substrate of FIG. 3 with a final layer of sacrificial material formed.

Turning to FIG. 4, the multi-layer structure 10 is completed by forming a final or top layer of sacrificial material 32 which overlies the third metal layer 28. It is anticipated that the multi-layer structure 10 illustrated in FIG. 4 will be constructed in a CMOS fabrication facility. Thereafter, the multi-layer structure 10 will be subjected to post-CMOS processing steps as discussed in conjunction with FIGS. 5–8. Although it is anticipated that the post-CMOS processing steps will be carried out in a different facility, that is not a requirement of the present invention.

Figure 5:
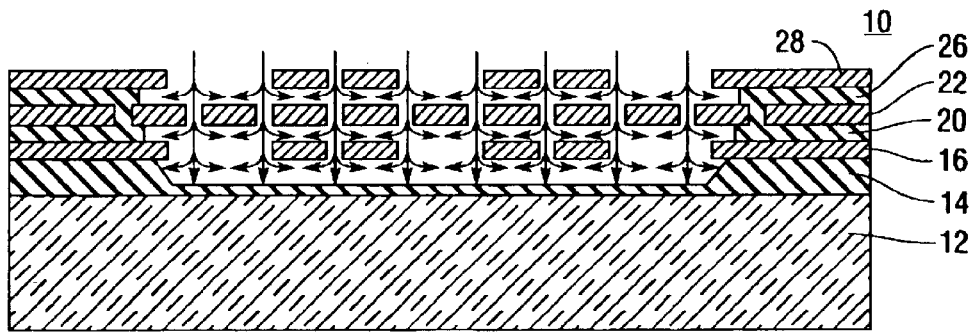
FIG. 5 illustrates a dry etch performed on the stacked layers of FIG. 4 with the use of an etch mask.

FIG. 5 illustrates the multi-layer structure 10 being subjected to a dry, isotropic etching process. The arrows in the figure illustrate the etching of the sacrificial layers 32, 26, 20 and finally 14. The dry etch can be a reactive ion etch (RIE), plasma etch, vapor HF etch or any etch suitable for removing the chosen sacrificial material. The RIE or plasma etch can be fluorine based gas for silicon dioxide sacrificial material or oxygen for organic dielectric sacrificial material. As shown in FIG. 5, the structure 10 is exposed to the etch without the application of a mask. The etching step releases the micro-machined mesh 30 formed in the third metal layer 28, the micro-machined metal mesh 24 formed in the second metal layer 22 and finally the micro-machined metal mesh 18 formed in the first metal layer 16. The mesh 18 is suspended a distance above the substrate 12 determined by the thickness of the base layer of sacrificial material 14. Similarly, the distance between meshes 18 and 24 is determined by the thickness of the first sacrificial layer 20 while the distance between meshes 24 and 30 is determined by the thickness of the second sacrificial layer 26. After the etch, no rinsing or similar cleaning process should be required.

Figure 6:
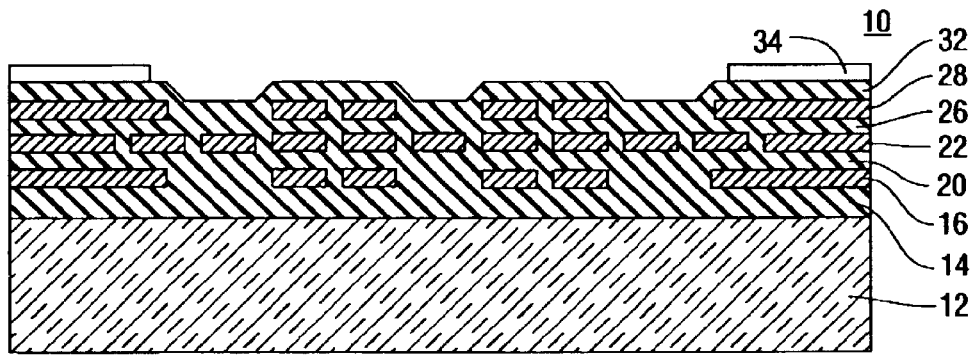
FIGS. 6 and 7 illustrate a dry etch performed on the stacked layers of FIG. 4 with the use of an etch mask.
Figure 7:
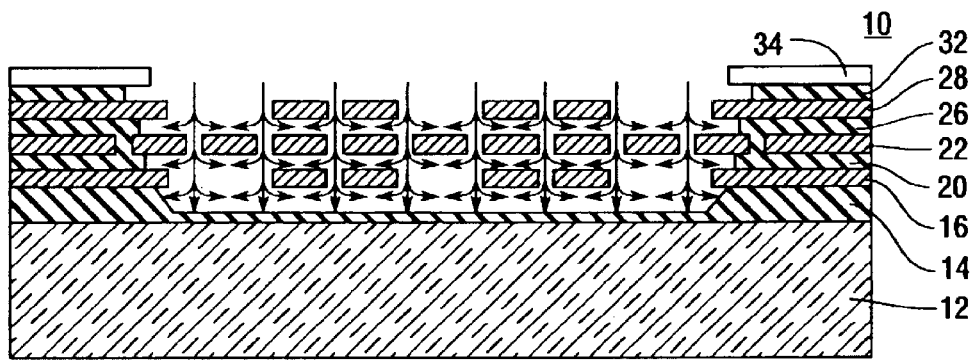

In FIG. 6, the multi-layer structure 10 of FIG. 4 is subjected to a dry isotropic etching step but in this case a mask 34 has been provided. Otherwise, the process proceeds in steps 6, 7 and 8 as previously described herein above in conjunction with FIG. 5. However, the resulting structure 10 illustrated in FIG. 8 has portions of the upper or top sacrificial layer 32 still intact as a result of using mask 34. The mask 34 can be removed using any standard techniques.

Figure 9:
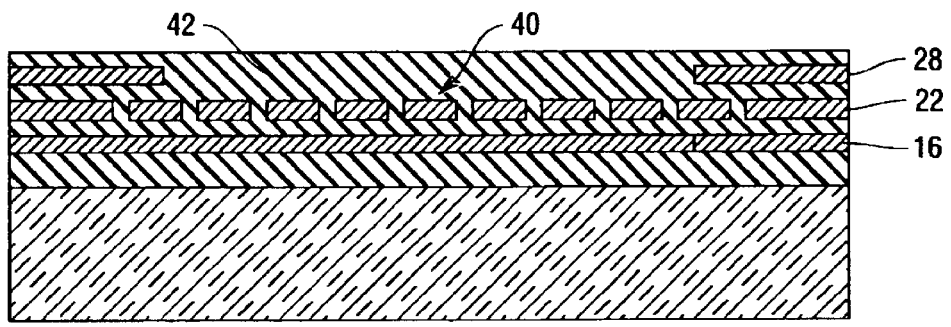
FIGS. 9 and 9A illustrate a variable capacitor constructed using the method of the present invention.
Figure 9A:
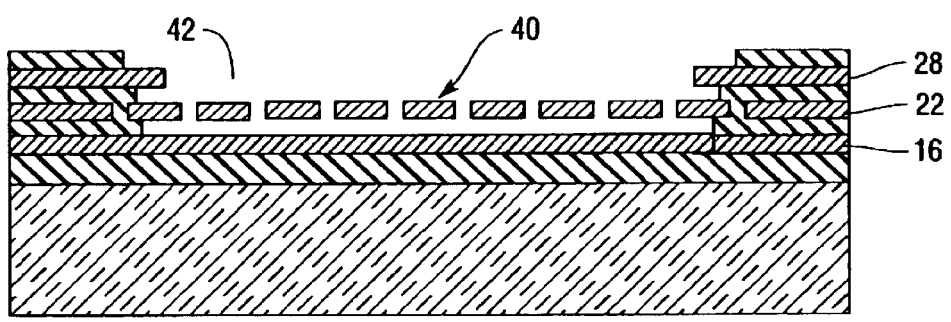

FIGS. 9 and 9A illustrate another device which may be constructed using the techniques of the present invention. In FIG. 9, a pattern of metal layers and sacrificial layers is built up as discussed above. However, for this device, the first metal layer 16 has no mesh formed therein. The second metal layer 22 has a mesh 40 formed therein while an opening 42 is provided in the third metal layer 28.

Alternatively, the third metal layer 28 may be omitted. The structure of FIG. 9 is subjected to an isotropic etch as shown in FIG. 9A which frees mesh 40 and stops at metal layer 16, which acts as an etch stop. The metal mesh 40 acts as a movable upper electrode while the first metal layer 16 acts as a lower electrode such that the device of FIG. 9 may operate as a variable capacitor.

Figure 10:
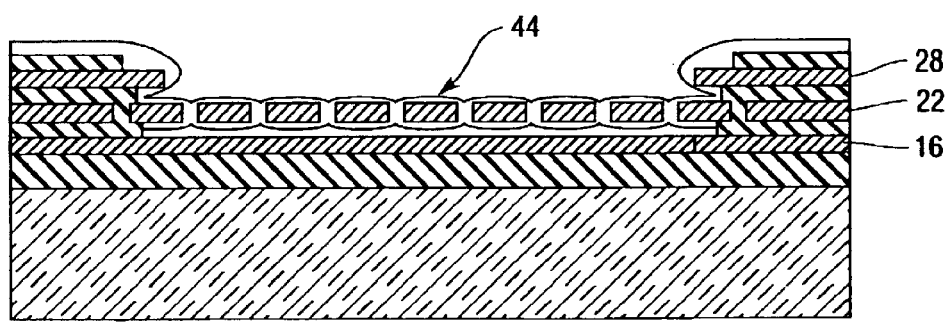
FIG. 10 illustrates the device of FIG. 9A after the mesh has been sealed thereby enabling the device of FIG. 10 to operate as a parallel plate microphone.

The device of FIG. 10 is similar to the device of FIG. 9A except that the mesh 40 has been sealed. The mesh 40 may be sealed using chemical vapor deposition techniques to deposit, for example, a polymer film thus sealing mesh 40 to form a flexible or movable diaphragm 44. Other techniques for sealing the mesh 40 include thermal evaporation. Other sealing materials include organic materials such as plastic, rubber, teflon, pyralene, polyamide etc. The device of FIG. 10 may operate as a simple parallel plate microphone.

Figure 8:
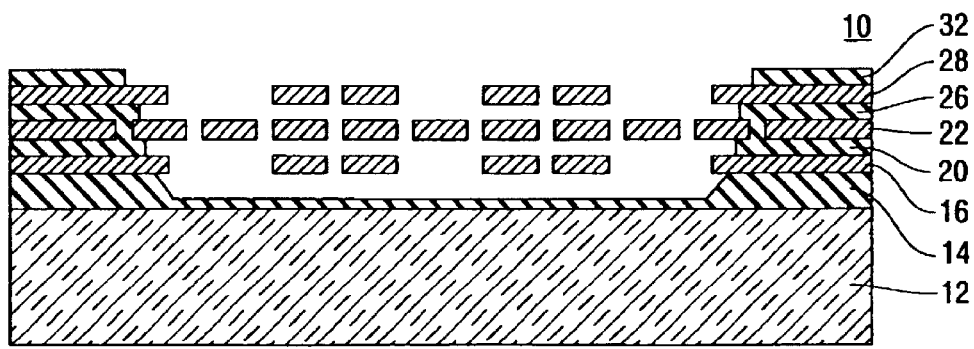
FIG. 8 illustrates the substrate of FIG. 7 with the etch mask removed.
Figure 11:
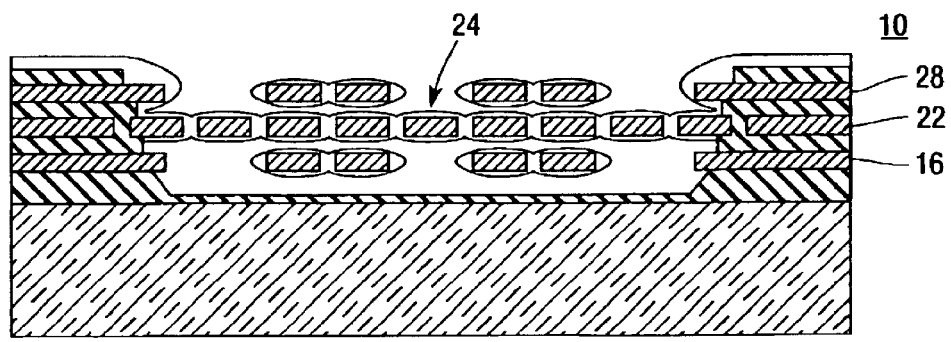
FIG. 11 illustrates the device of FIG. 8 in which the micro-machined metal mesh of the second metal layer has been sealed thereby enabling the device of FIG. 11 to operate as a differential parallel plate microphone.
Figure 12A:
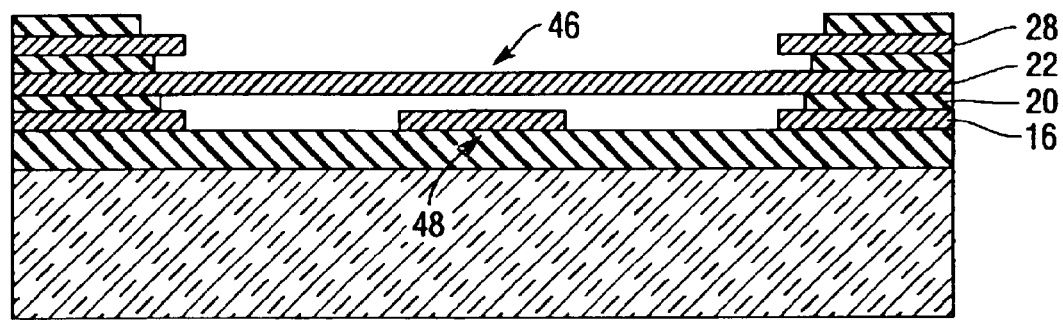
FIGS. 12A and 12B illustrate a first embodiment of a switch constructed according to the present invention.
Figure 12B:
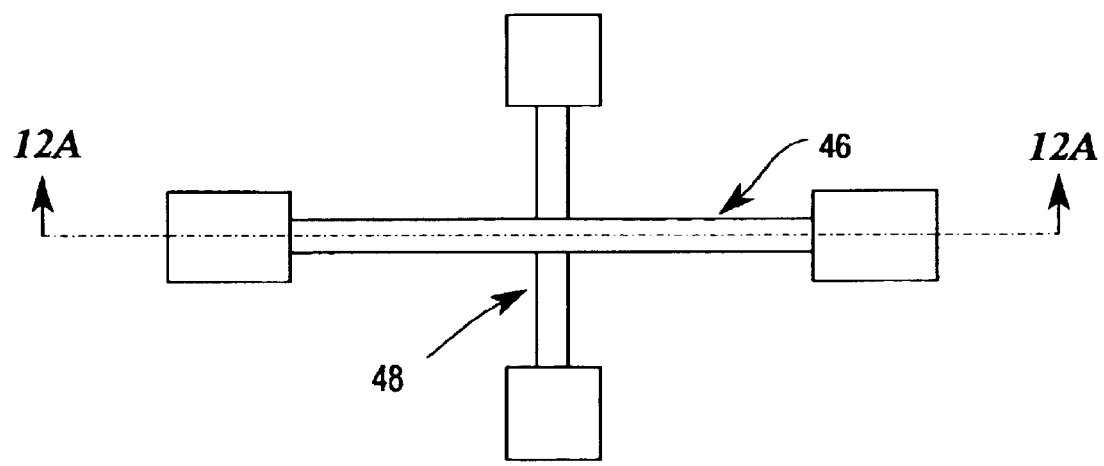

Turning to FIG. 11, the structure 10 illustrated in FIG. 8 is subjected to a sealing step for the purpose of sealing mesh 24 formed in a portion of the second metal layer 22. Such a structure is capable of operating as a differential type parallel plate microphone.

It is not a requirement of the present invention that meshes be formed in any of the various metal layers. For example, FIGS. 12A, 12B, 13A and 13B illustrate switches constructed according to the principals of the present invention in which beams, rather than meshes, are formed by the various layers of metal. For example, in FIG. 12A, a beam 46 is formed in the second metal layer 22. The distance between the beam 46 and a lower beam 48 formed in the first metal layer 16 is determined by the thickness of the first sacrificial layer 20. As seen in the FIG. 12B, the movable beam 46 is orthogonal to the lower beam 48.

Figure 13A:
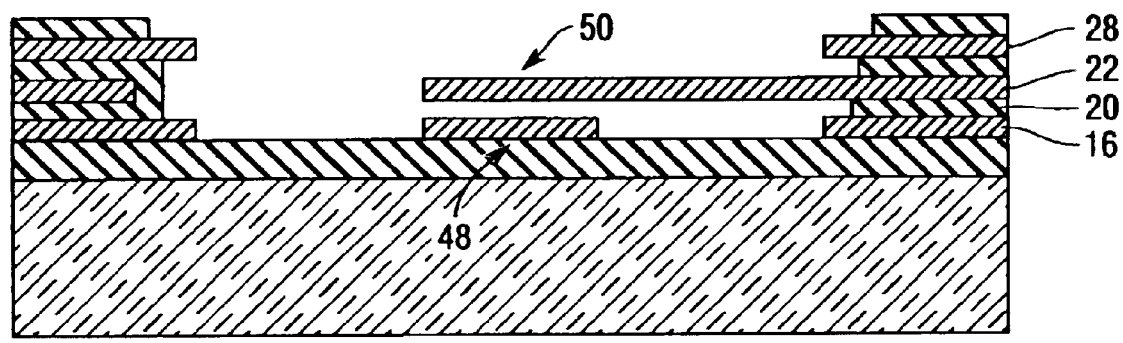
FIGS. 13A and 13B illustrate a second embodiment of a switch constructed according to the present invention.
Figure 13B:
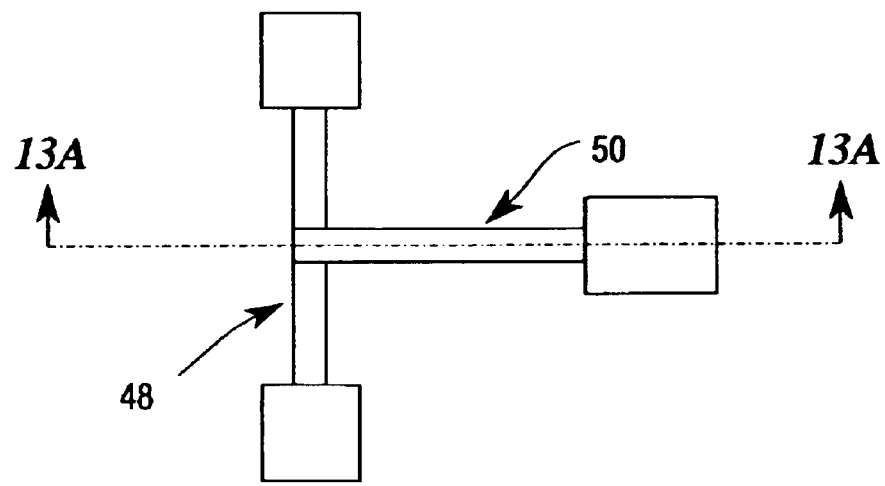

Another embodiment of a switch constructed according to the principals of the present invention is illustrated in FIGS. 13A and 13B. In FIGS. 13A and 13B, the movable upper beam takes the form of a cantilevered beam 50.

The present invention builds MEMS structures composed of only metal layers as the structural material, distinguishing it from prior post-CMOS micromachining processes, where MEMS structures are made of composite metal and dielectric materials. The process of the present invention is capable of building devices with metal structures attached to the silicon substrate with unique movement capability. In addition to all the other types of motion which can be achieved in conventional post-CMOS processes, e.g. relative in-plane and out-of-plane motion of the MEMS structures made of metal and dielectric, the process of the present invention can make laminated mechanical structures made by different levels of metal interconnect have relative movement.

The MEMS structural metal material comes from standard semiconductor process metal interconnects, for example aluminum or copper, which are current main stream CMOS manufacturing materials. The sacrificial material is the dielectric material between metal layers. No additional sacrificial material needs to be added to the CMOS process.

Unlike other post-CMOS micromachining process, etching into the silicon substrate is not required for releasing the MEMS structures. The present invention uses CMOS metal as the structural material and most surface micromachining techniques use poly-silicon as the structural material. The present invention may be applied to existing CMOS chips without any modification of the CMOS process.

A broad spectrum of applications can be developed using the process of the present invention, for example, microphone/microspeakers for use in cell phones, PDAs, laptop computers, digital cameras, hearing aids, toys and recording/broadcasting applications, and tunable parallel-plate capacitors and RF-MEMS switches that can be used in wireless communication and circuit design.

While the present invention has been described in connection with preferred embodiments thereof, those of ordinary skill in the art will recognize that many modifications and variations are possible. The present invention is intended to be limited only by the following claims and not by the foregoing description which is intended to set forth the presently preferred embodiment.

What is claimed is:

1. A structure, comprising:

first, second and third stacked metal layers carried by a substrate, each of said metal layers have a micro-machined mesh formed in at least a portion thereof, each of said metal layers being supported by a sacrificial layer with the sacrificial layer removed in the area of said micro-machined meshes such that each micro-machined mesh is suspended at a height determined by the thickness of its respective underlying sacrificial layer; and a material for sealing the micro-machined mesh formed in said second metal layer to form a membrane and wherein said micro-machined mesh in said first metal layer functions as a lower electrode and wherein said micro-machined mesh of said third metal layer functions as an upper electrode.

2. The structure of claim 1 wherein said material for sealing is a material selected from the group consisting of plastic rubber, Teflon®, pyralene, and polyamide.

3. A structure, comprising:

a substrate carrying first and second stacked metal layers having a first micro-machined mesh and a second micron-machined mesh, respectively, formed in at least a portion of the respective metal layer, each of said metal layers being supported by a sacrificial layer with the sacrificial layer removed in the area of said micro-machined meshes such that each micro-machined mesh is suspended at a height determined by the thickness of its respective underlying sacrificial layer, the spacing of the mesh of said second micro-machined mesh being greater than the spacing of the mesh of said first micro-machined mesh; and a material for sealing only said first micro-machined mesh to form a membrane.

4. The structure of claim 3 additionally comprising a base layer of sacrificial material carried by said substrate and supporting a base metal layer having a micro-machined mesh formed therein, and wherein said base sacrificial layer is removed in the area of said micro-machined mesh such that said micro-machined mesh is suspended above said substrate a height determined by the thickness of said base sacrificial layer.

5. The structure of claim 4 wherein said micro-machined mesh of said base metal layer functions as a lower electrode and wherein said micro-machined metal mesh of said second metal layer functions as an upper electrode.

6. The structure of claim 3, wherein said seal is formed with a material selected from the group consisting of plastic, rubber, Teflon®, pyralene, and polyamide.

* * * * *

UNITED STATES PATENT AND TRADEMARK OFFICE
CERTIFICATE OF CORRECTION

PATENT NO.        : 6,943,448 B2
APPLICATION NO. : 10/349619
DATED              : September 13, 2005
INVENTOR(S)        : Kaigham J. Gabriel and Xu Zhu It is certified that error appears in the above-identified patent and that said Letters Patent is hereby corrected as shown below:

Column 2, Line 67, delete "second" and substitute therefore --third--.

Column 3, Line 6, delete "with" and substitute therefore --without--.

Signed and Sealed this

Twenty-sixth Day of June, 2007

JON W. DUDAS
*Director of the United States Patent and Trademark Office*